United States Patent [19]

Norton et al.

[11] 4,240,119
[45] Dec. 16, 1980

[54] COMPUTERIZED LASER ENGRAVING SYSTEM AND METHOD

[75] Inventors: Lyle K. Norton, Costa Mesa; Robert J. Prichard, Anaheim; Margit K. Ochi, Newport Beach, all of Calif.

[73] Assignee: EOCOM Corporation, Irvine, Calif.

[21] Appl. No.: 912,505

[22] Filed: Jun. 5, 1978

Related U.S. Application Data

[63] Continuation-in-part of Ser. No. 892,485, Mar. 31, 1978, abandoned.

[51] Int. Cl.$^3$ ............................ G03F 7/02; G06F 3/12
[52] U.S. Cl. .................................... 358/297; 358/256; 358/280; 358/302; 364/900
[58] Field of Search ............... 358/256, 280, 297, 302, 358/298, 299; 364/200 MS File, 900 MS File

[56] References Cited

U.S. PATENT DOCUMENTS

| | | | |
|---|---|---|---|
| 3,828,319 | 8/1974 | Owen et al. | 364/200 |
| 3,949,159 | 4/1976 | Ricards et al. | 358/297 X |
| 3,980,994 | 9/1976 | Ying et al. | 364/200 |
| 4,013,876 | 3/1977 | Anstin | 358/302 X |
| 4,069,511 | 1/1978 | Lelke | 364/200 |
| 4,075,695 | 2/1978 | Lelke | 364/200 |
| 4,081,842 | 3/1978 | Harbaugh et al. | 358/256 |
| 4,135,212 | 1/1979 | Pugsley et al. | 358/256 |

*Primary Examiner*—Raymond F. Cardillo, Jr.
*Assistant Examiner*—Donald McElheny, Jr.
*Attorney, Agent, or Firm*—Flehr, Hohbach, Test, Albritton & Herbert

[57] ABSTRACT

System and method utilizing a computer and a laser platemaker for the reproduction of information on photosensitive surfaces, as in the production of printing plates. The platemaker includes a reading beam for scanning data such as text, logotypes, line art and halftones from a read platen or copy board and a writing beam for imaging data on a writing surface or platen. Data from the reading beam is transferred to the computer which controls the modulation of the writing beam. The system provides high speed electronic composition or pagination of any combination of data created by the computer or scanned by the reading beam.

8 Claims, 15 Drawing Figures

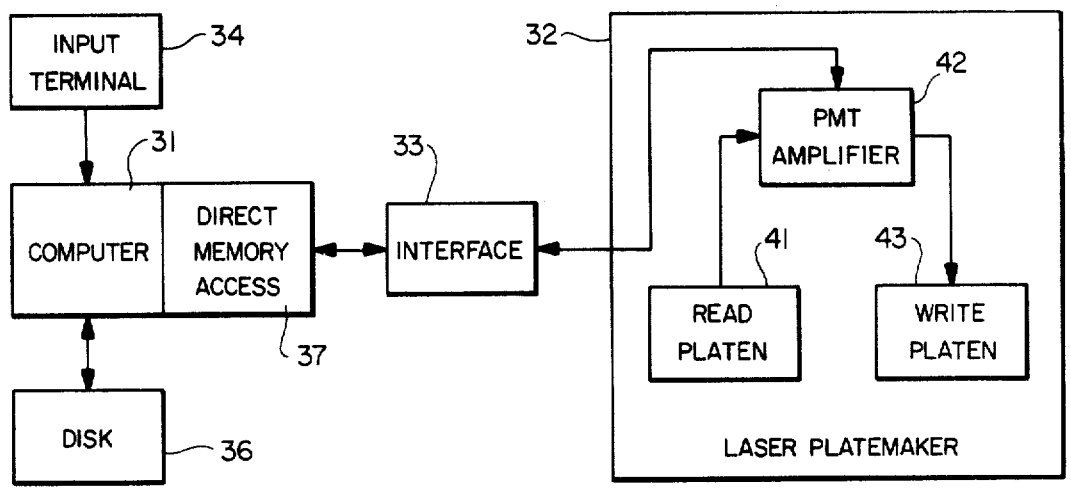
FIG__1
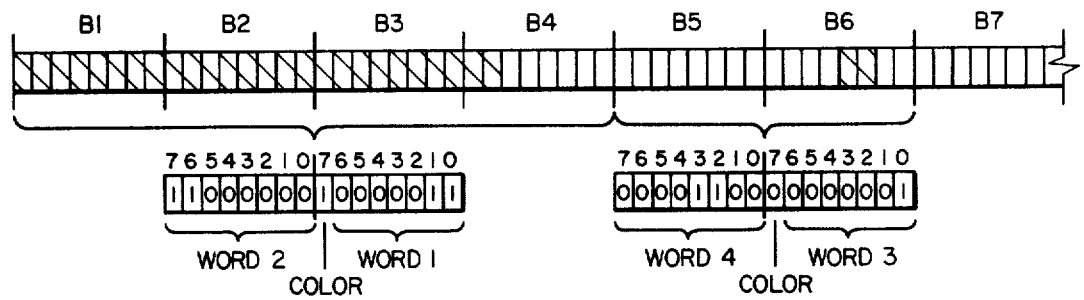
FIG__2
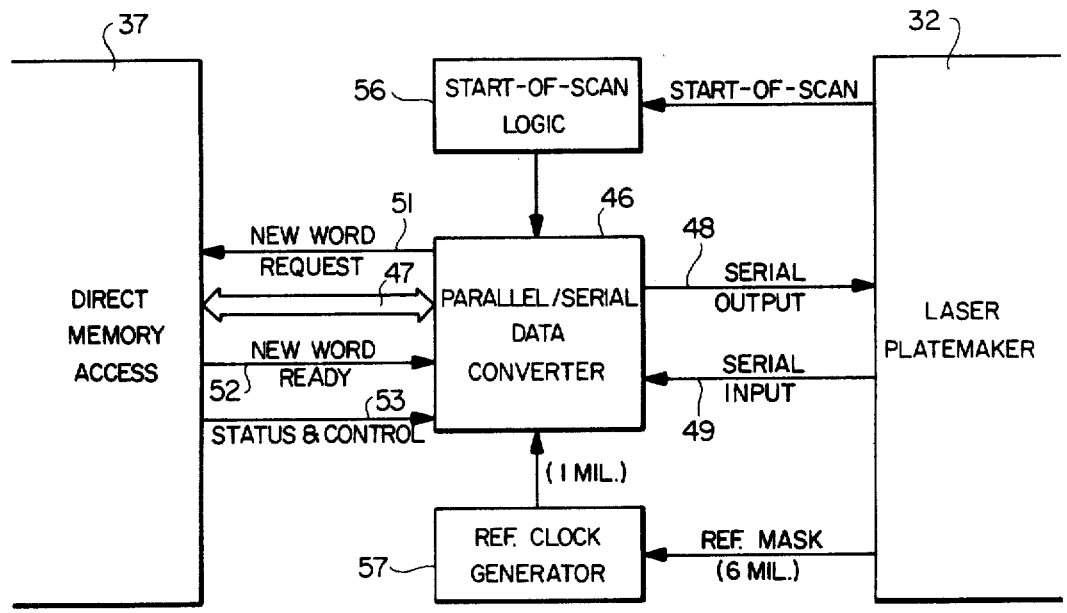
FIG__3

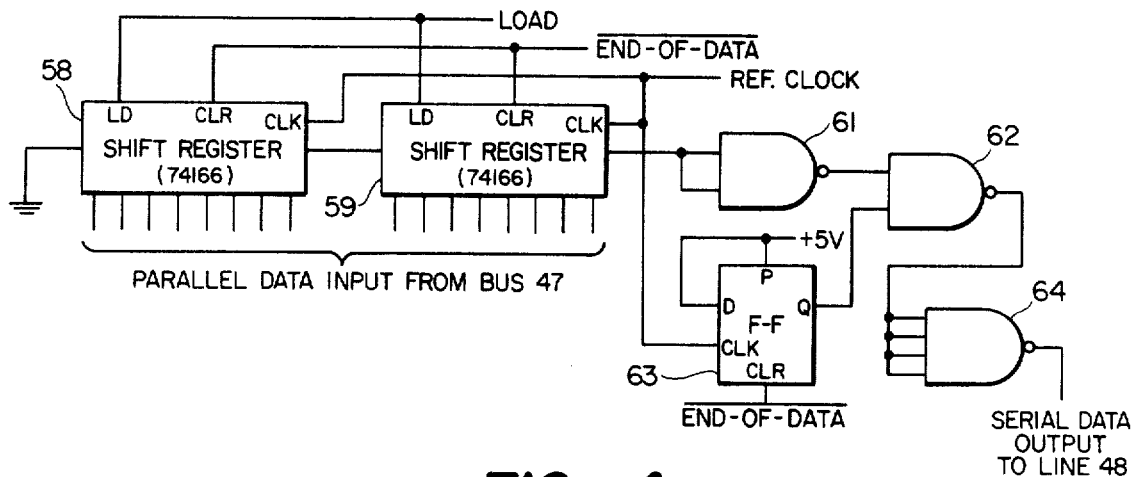
FIG_4
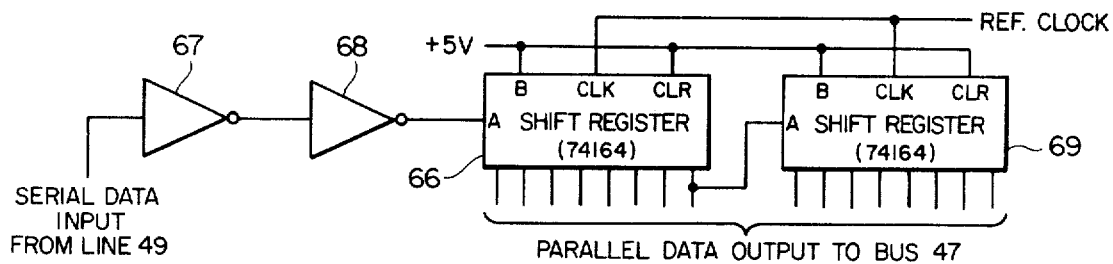
FIG_5
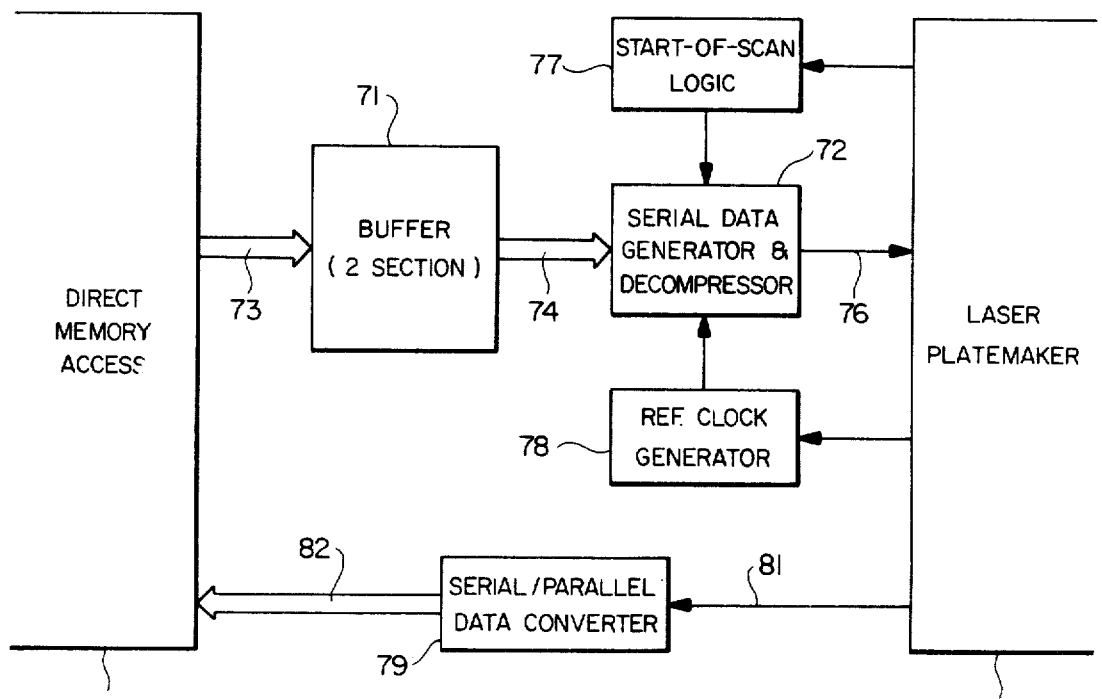
FIG_6

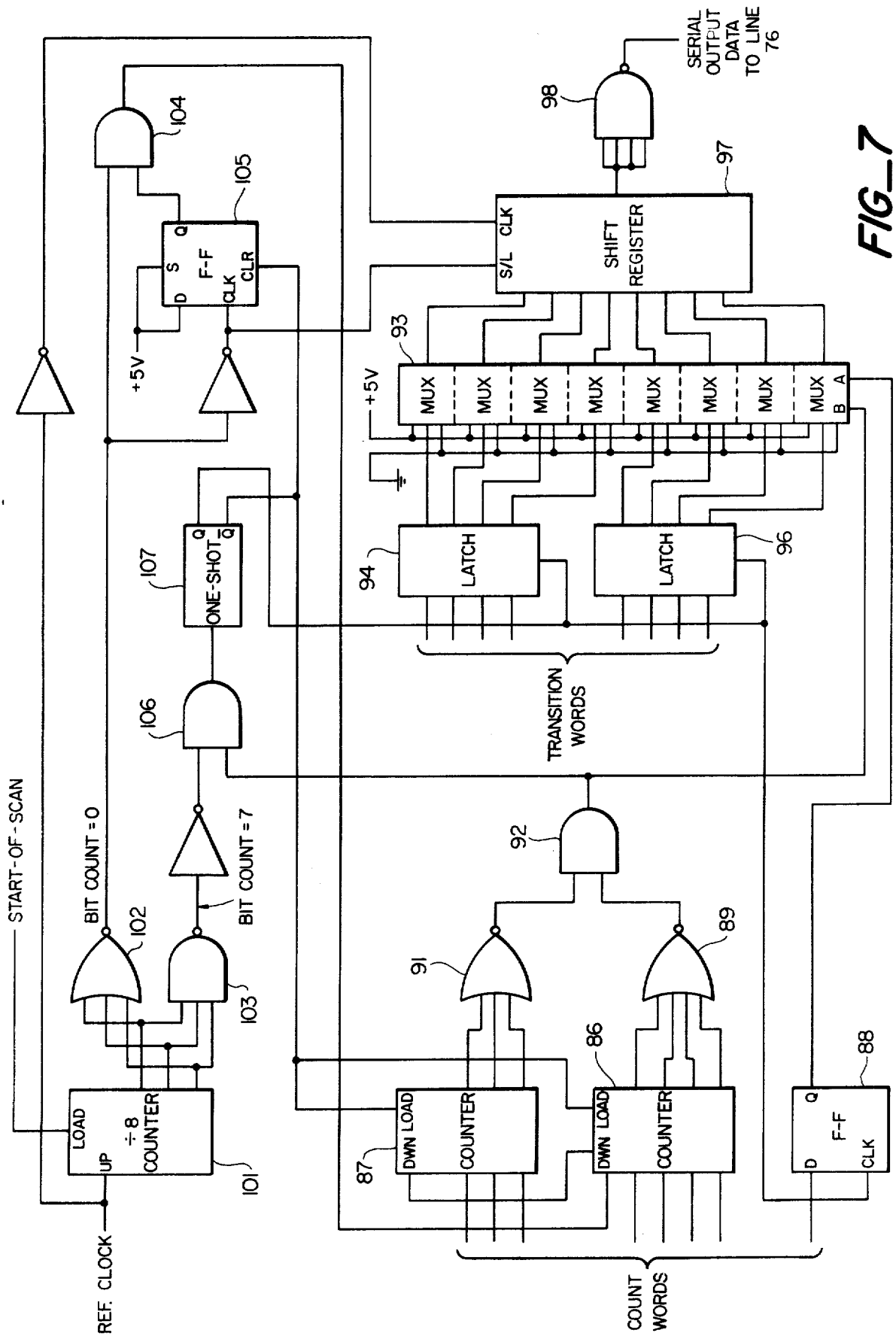
FIG_7

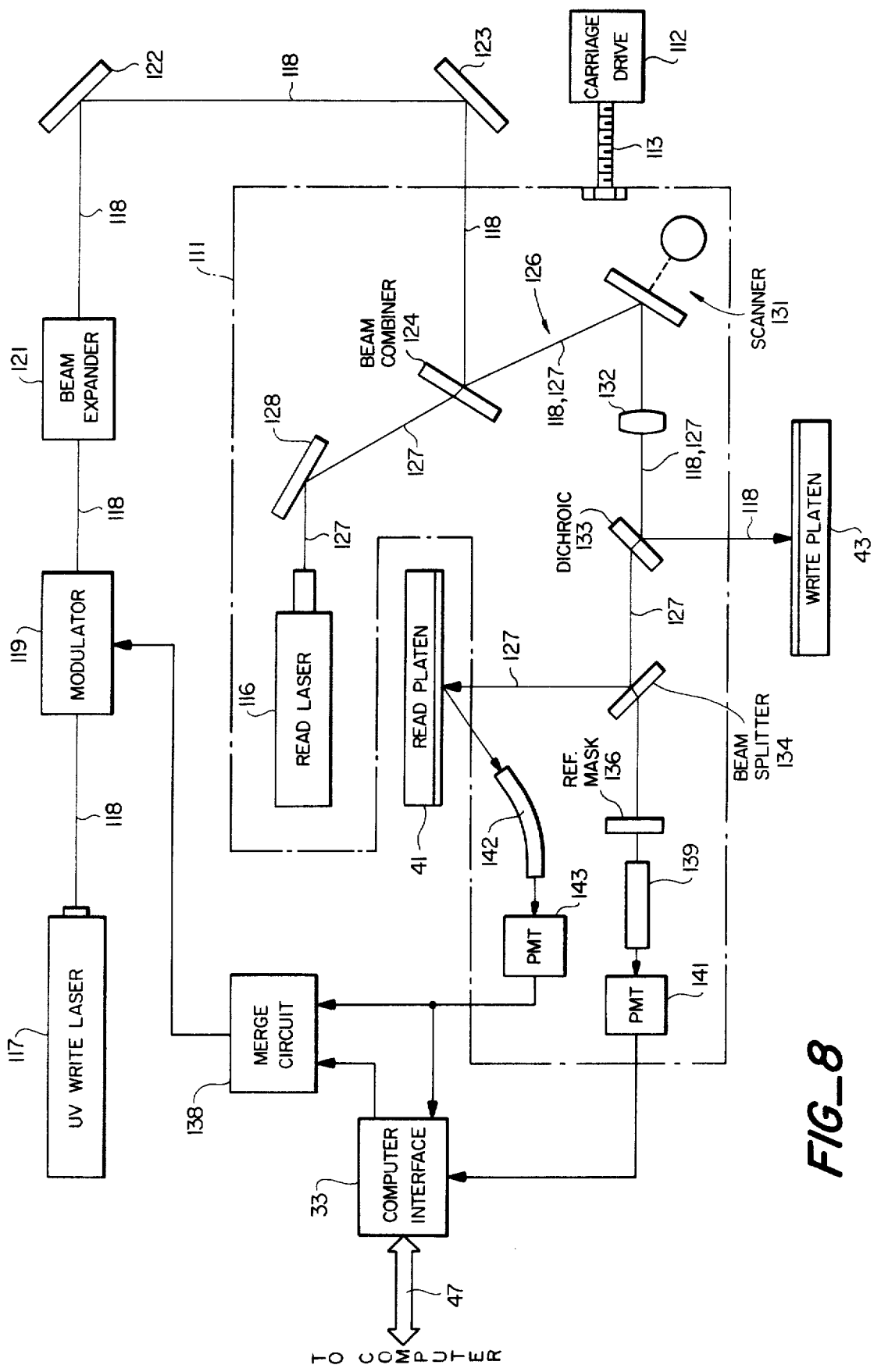
FIG_8

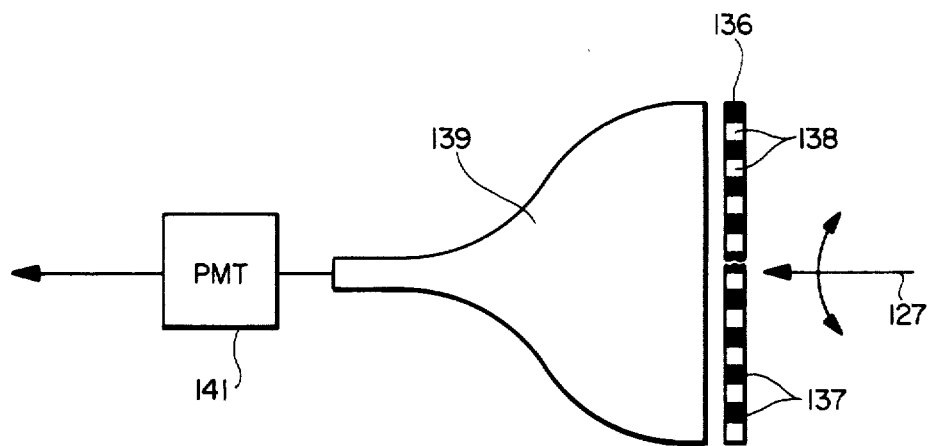
FIG_9
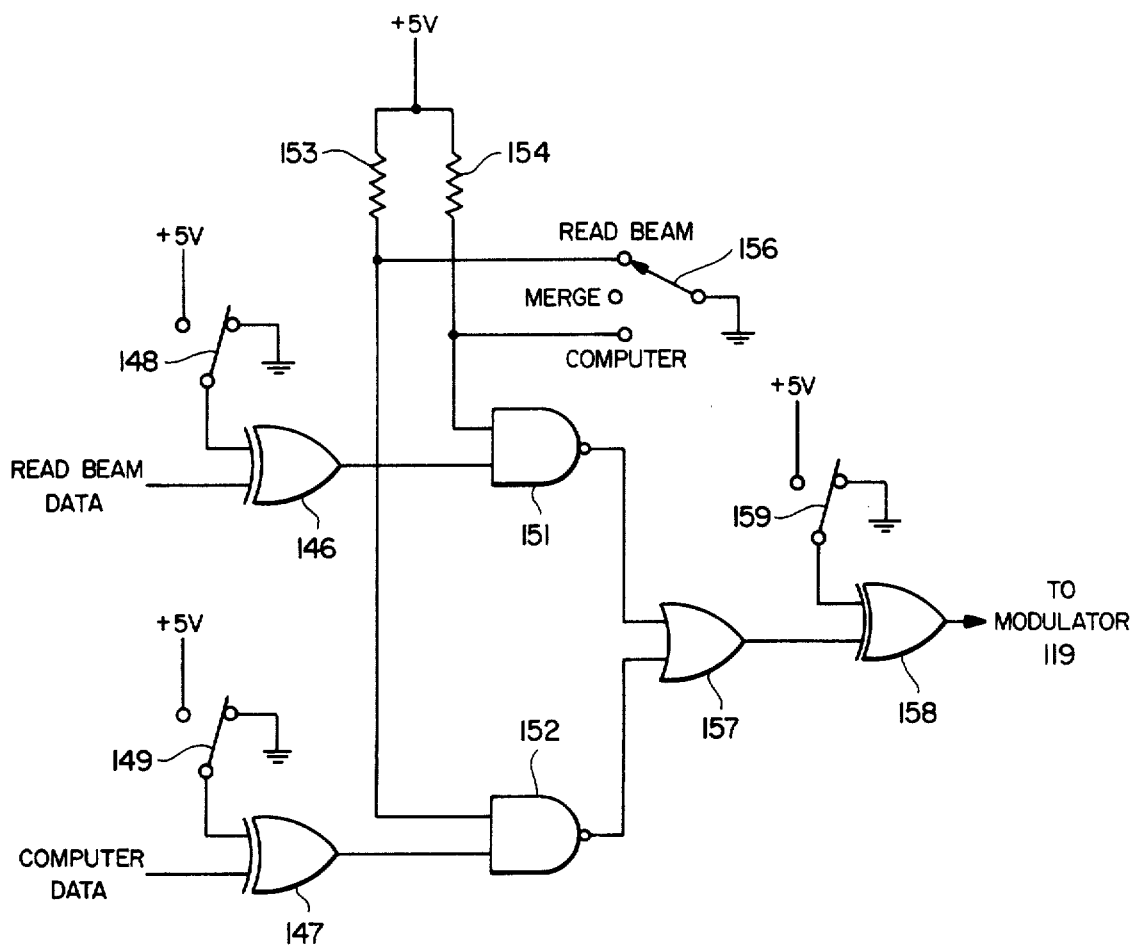
FIG_10

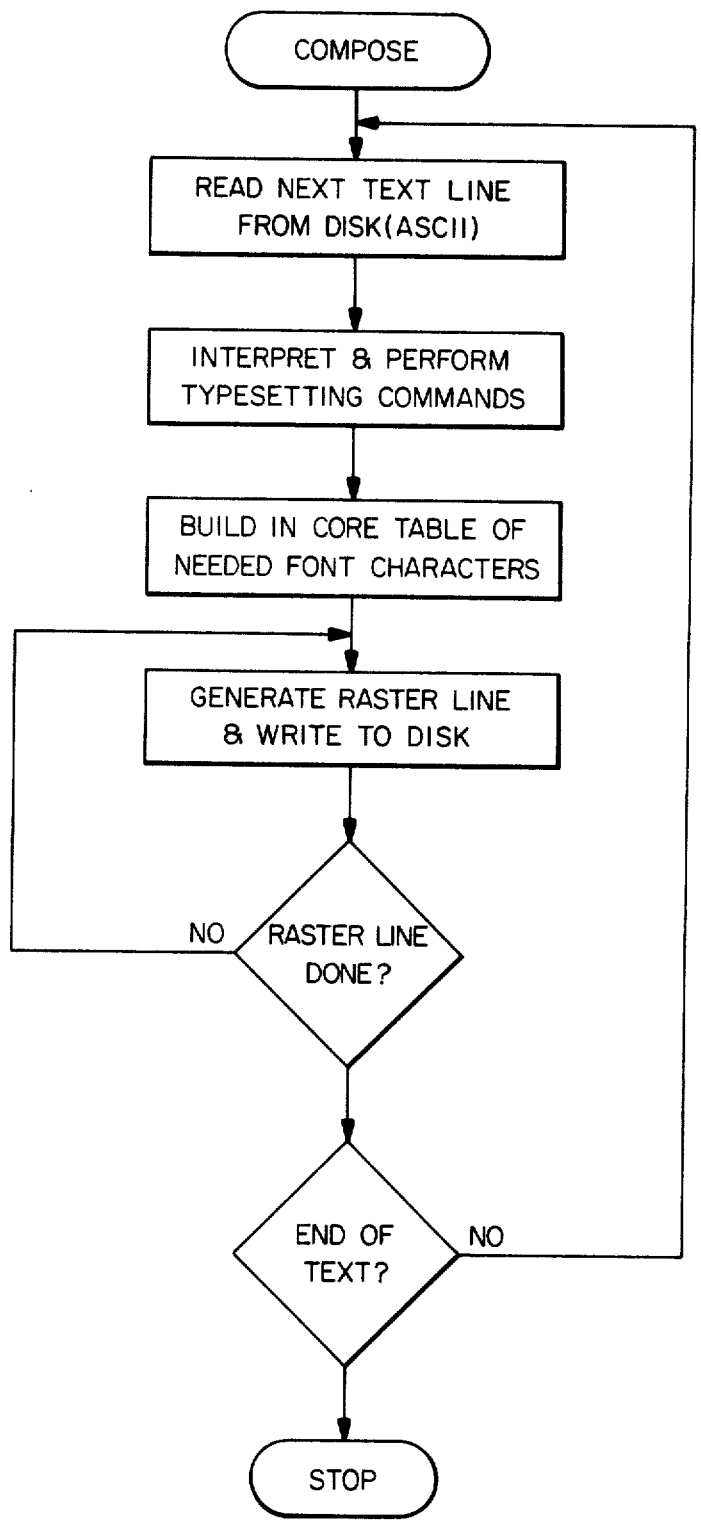
FIG_11

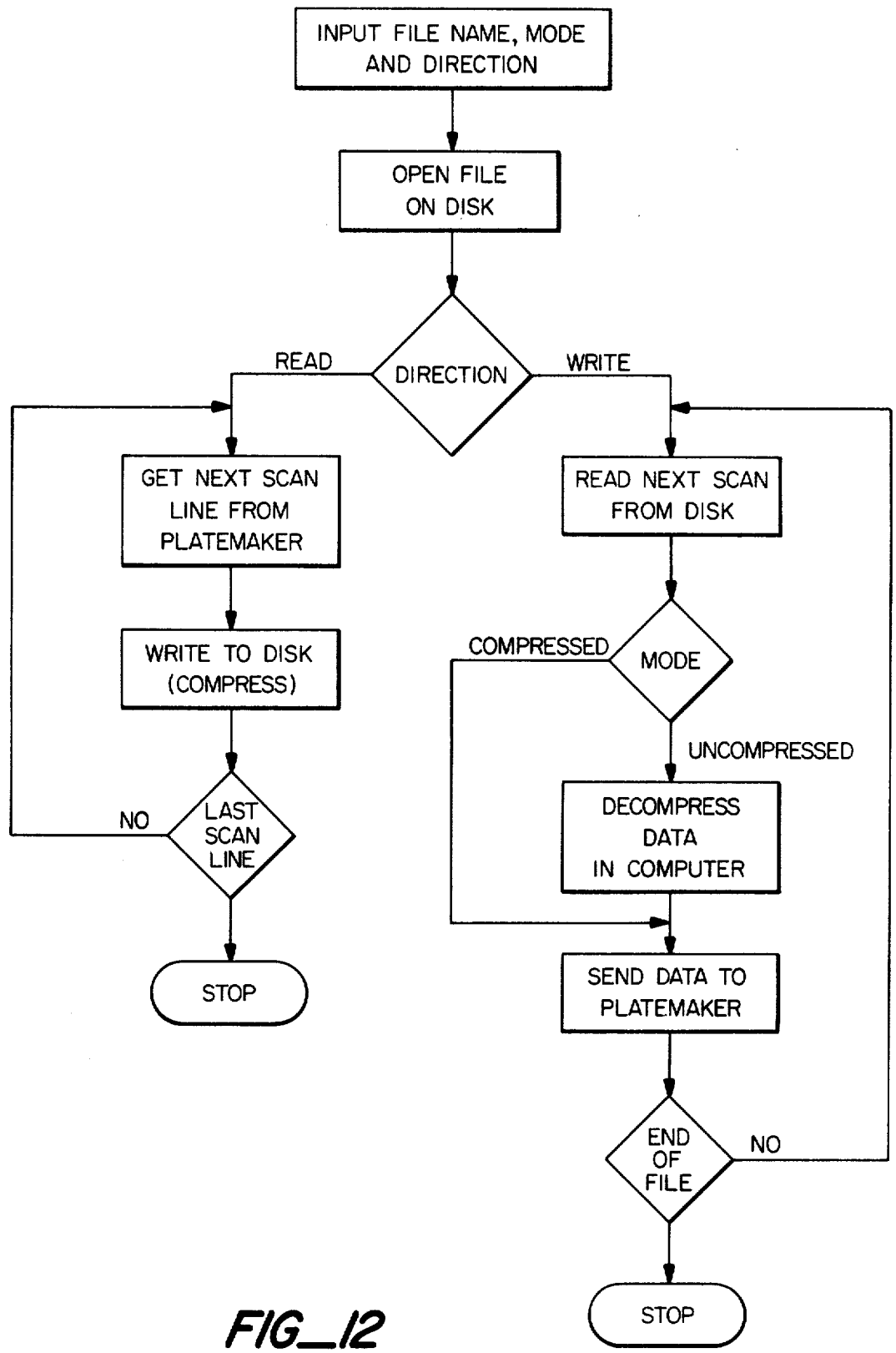
FIG_12

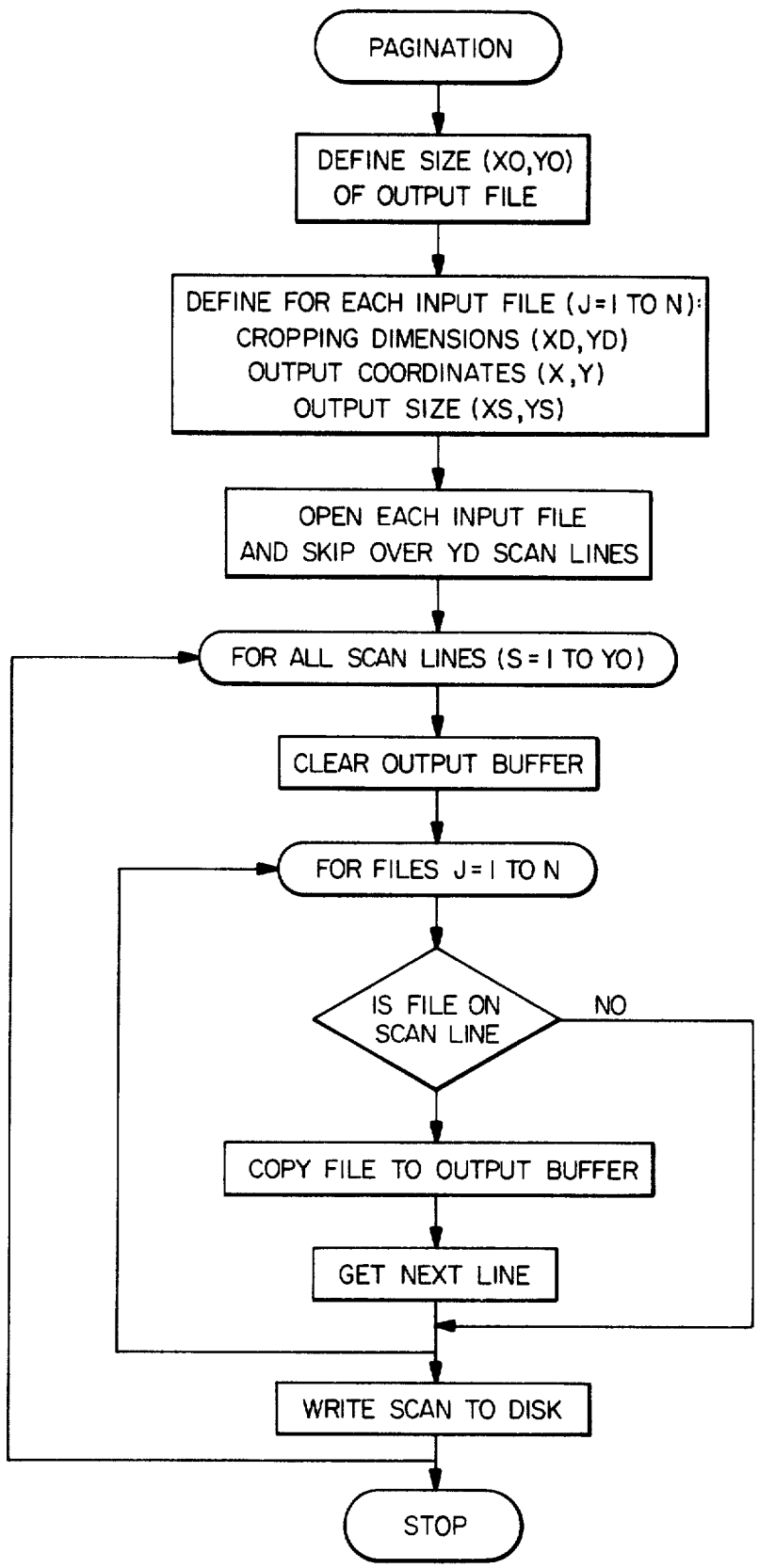
FIG_13

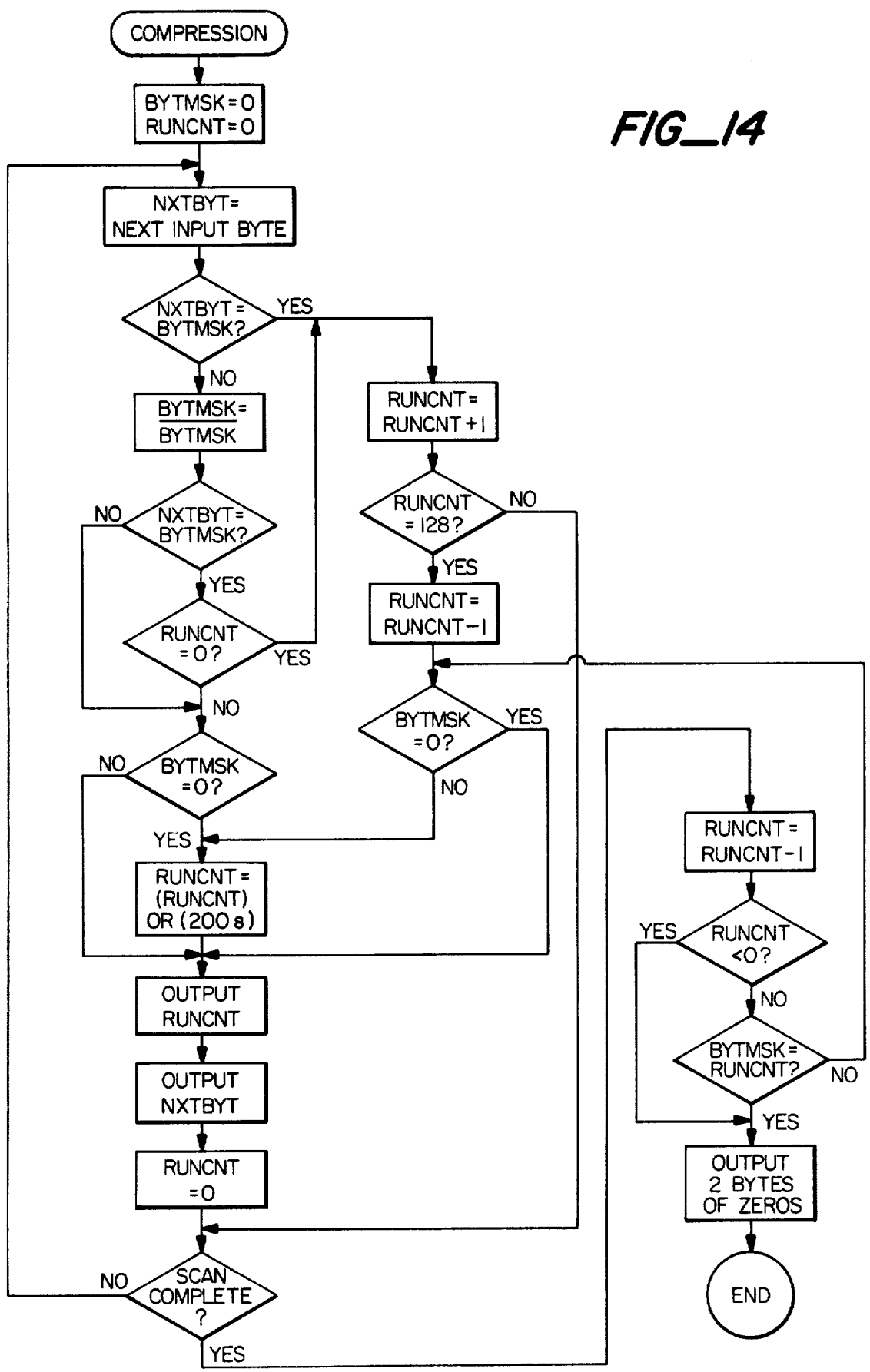
FIG_14

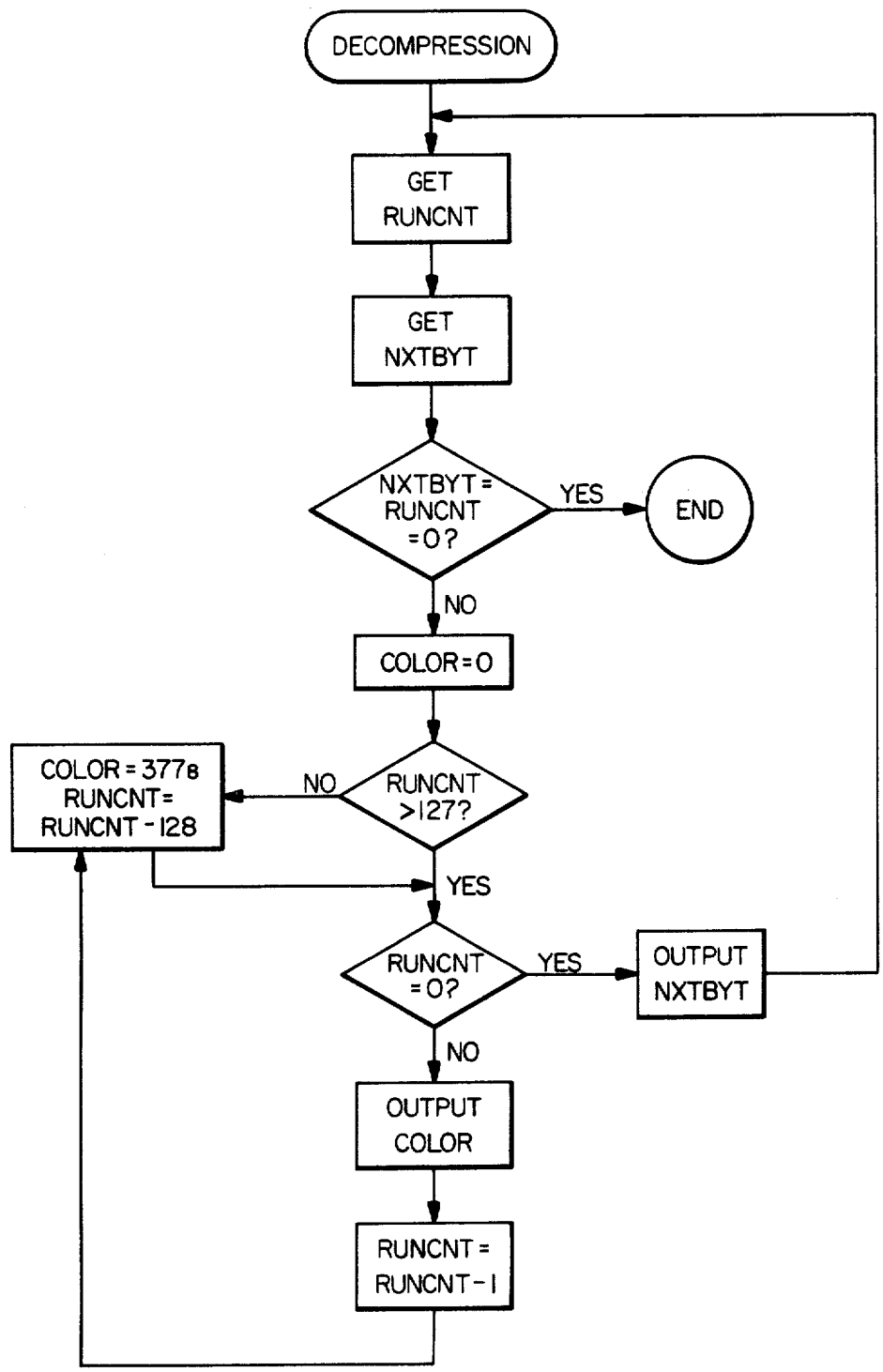
FIG_15

COMPUTERIZED LASER ENGRAVING SYSTEM AND METHOD

CROSS REFERENCE TO RELATED APPLICATIONS

This is a continuation-in-part of application Ser. No. 892,485, filed Mar. 31, 1978, now abandoned. Reference is made to copending application Ser. No. 758,250, filed Jan. 10, 1977 in the name of Richard E. Amtower for a LASER READ-WRITE SYSTEM FOR THE PRODUCTION OF ENGRAVINGS and to U.S. Pat. No. 4,081,842, issued Mar. 28, 1978 to Steven K. Harbaugh and Richard E. Amtower for a FACSIMILE SYSTEM.

BACKGROUND OF THE INVENTION

This invention pertains generally to the reproduction of information on photosensitive surfaces, as in the production of printing plates, and more particularly to a system and method for electronic composition of a page from computer generated text and material read from a copy board or other reading surface.

In the offset printing process which has been employed for a number of years in the newspaper publishing and commercial printing industries, printed text, photographs and other graphic materials are assembled manually together to form a so-called "paste-up" of each page to be printed. A printing plate is then made from the paste-up, typically by a photographic process. This traditional prepress process is time consuming, requiring on the order of 40–60 minutes per page once the copy is ready to begin the paste-up operation.

In recent years, computers have been employed in the creation, storage and editing of text and have significantly reduced the time required for this portion of the prepress operation. Another significant reduction of time in the prepress operation has resulted from the development of a laser platemaker having reading and writing beams for simultaneously scanning the paste-up and plate. Such a device is described in application Ser. No. 758,250 referenced above.

For some time now, it has been thought that even greater savings in time could be achieved by utilizing the computer in which the text is created, stored and edited to drive the plate making device. However, prior to the present invention, no one to the knowledge of the inventors has been able to provide a commercially feasible all electronic prepress system. U.S. Pat. No. 3,949,159, issued Apr. 6, 1976, describes a system for combining computer generated text with photographs and other materials read from a drum. However, the material from the drum can only be reproduced in real time and in the same relative position in which it appears on the drum. There is no provision for storing data read from the drum, no provision for editing such data, and no provision for forming a page with data read from the drum in another position, size or format.

SUMMARY AND OBJECTS OF THE INVENTION

The invention provides a system and method which achieve total flexibility in an all electronic prepress system. The system includes a laser platemaker having a reading beam for scanning a read platen or copy board and a writing beam for scanning a write platen or printing plate. The system also includes a computer for creating, storing and editing data and converting data to raster format for presentation to the platemaker. An interface between the computer and platemaker permits data to pass either from the computer to the writing beam control of the platemaker or from the reading beam of the platemaker to the computer. Three basic modes of operation are provided: imaging of data created by the computer, imaging of data input through the reading beam, and imaging of a combination of data from the computer and reading beam. Whether created by the computer or input from the plate maker, the data stored in the computer can be edited and imaged in any desired order, position or manner. Data is stored in the computer memory in a byte-oriented run length encoded format which is more efficient than more conventional bit-oriented compression techniques of the prior art.

It is in general an object of the invention to provide a new and improved computerized laser engraving system and method which are particularly suitable for the newspaper publishing and commercial printing industries but are not limited thereto.

Another object of the invention is to provide a system and method of the above character which can selectively image data created by a computer and data input through a reading beam in any desired combination and in any desired position, order or manner.

Another object of the invention is to provide a system and method of the above character in which data to be imaged is stored in a byte-oriented run length encoded format.

Additional objects and features of the invention will be apparent from the following description in which the preferred embodiments are set forth in detail in conjunction with the accompanying drawings.

BRIEF DESCRIPTION OF THE DRAWINGS

FIG. 1 is an overall block diagram of one embodiment of a computerized laser engraving system according to the invention.

FIG. 2 is a diagrammatic illustration of data encoded in accordance with a preferred run length compression technique for storage in the system of FIG. 1.

FIG. 3 is a block diagram of one embodiment of an interface unit for the system of FIG. 1.

FIG. 4 is simplified circuit diagram of a parallel-to-serial data converter for the interface unit of FIG. 3.

FIG. 5 is a simplified circuit diagram of a serial-to-parallel converter for the interface unit of FIG. 3.

FIG. 6 is a block diagram of a second embodiment of an interface unit for the system of FIG. 1.

FIG. 7 is a simplified circuit diagram of the data converter and decompressor of the interface unit of FIG. 6.

FIG. 8 is a schematic diagram of a preferred laser platemaker for use in the embodiment of FIG. 1.

FIG. 9 is a schematic diagram illustrating the reference mask of the platemaker of FIG. 8.

FIG. 10 is a circuit diagram of a circuit for selectively presenting data from either the computer or the reading beam to the writing beam control of the platemaker.

FIG. 11 is a flow chart of a preferred program for generating raster scan line data in the system of FIG. 1.

FIG. 12 is a flow chart of a preferred program for transferring scan line data between the computer and the platemaker in the system of FIG. 1.

FIG. 13 is a flow chart of a preferred program for pagination or combination of data from the computer and platemaker in a single raster image.

FIGS. 14 and 15 are flow charts of preferred program routines for compression and decompression of data stored in the system of FIG. 1.

DESCRIPTION OF THE PREFERRED EMBODIMENTS

As illustrated in FIG. 1, the system comprises a computer 31, a laser platemaker 32, and an interface unit 33 between the computer and platemaker.

In the preferred embodiment, the computer is a Digital Equipment Corporation (DEC) PDP-11/05 minicomputer which operates in a 16-bit format and includes a 28K internal memory. It is to be understood, however, that the invention is not limited to a particular type of computer or a particular word size. The computer is provided with a conventional input terminal 34 and a standard magnetic memory disk 36, as well as a direct memory access interface 37 such as a Digital Equipment Corporation Model DR11B.

A preferred laser platemaker for use in the system of FIG. 1 is illustrated in FIGS. 8-9 and is hereinafter described in detail. Briefly, the platemaker includes a reading laser beam which scans or traverses in raster fashion across a read platen 41, picking up reflected energy which is converted into a series of black/white signals in a photomultiplier tube amplifier 42. The platemaker also includes a writing laser beam which scans a write platen 43 in synchronization with the scanning action of the reading beam. Interface unit 33 is connected to the platemaker in such manner that information read from read platen 41 can be transferred to the computer and data from the computer can be transferred to the platemaker to control the intensity of the writing beam.

This system can image plates in three different modes: (1) a local mode in which data read from platen 41 is transferred directly to the plate or write platen 43, (2) a computer mode in which digital data from the computer is written on the plate, and (3) a merge mode in which data from the computer is imaged simultaneously with data from the read platen. In addition, data stored in the computer memory for individual files or raster images can be combined to produce a complete page or other composite raster image.

When text is entered from terminal 34, it is initially written on disk 36 in a text file which contains source information and embedded type setting commands. Since the write platen or plate is scanned in raster fashion and each text line is made up of a number of scan lines, it is necessary to convert the text file or source file to a raster image format before it is transmitted to the platemaker. For newspaper printing, the platemaker might typically have a resolution in the Y-direction of 1,000 lines per inch and 1,000 bits or points per inch in the X-direction. With this resolution, a scan line sixteen inches wide would require 16,000 bits of black/white information. In order to generate text ten inches high, 10,000 scan lines consisting of 16,000 bits each would be required. As the source or text file is converted to raster image format, it is stored on the disk in the form of a raster image file. This file can then be transferred from the disk to the platemaker under the control of the computer. The raster file can also be combined with other raster files stored on the disk to produce a new raster file for transmission to the platemaker. Raster files can also be created by transmitting data read from platen 41 to the computer for storage on the disk. Such data can include textual material, logotypes, halftones and the like.

In order to conserve space on disk 36, the raster files are stored in a compressed format. The compression scheme is illustrated in FIG. 2 and can be described as byte-oriented run length encoding. Run length encoding takes advantage of the fact that along a given scan line black and white bits generally occur in groups or strings, rather than alternating black/white/black/white and so on. In standard run length encoding, the number of bits in each group or string is stored, rather than storing the data for each individual bit. With run length encoding, for example, data for up to 128 bits can be stored in only 8 bits of storage. This technique does not work well, however, where the string length is less than the word in which the length information is stored. Another disadvantage of standard run length encoding is that it requires the computer to operate at the bit level, rather than operating at the full width of its data path where it is more efficient.

In the data compression system of the invention, run lengths are encoded in terms of bytes rather than bits. In this system, the scan line is divided into a number of bytes of given length, e.g. 8 bits, and the number of successive bytes which are all the same color is stored in the first seven bits of an 8-bit word, and the color of the string is stored in the remaining bit. In a second 8-bit word, the data is stored for the byte in which the transition occurs. In the example of FIG. 2, bytes B1-B3 are all black, and the first transition occurs after the second bit in byte B4. Thus, the binary number 0000011 is stored in the first seven bits of word 1, and a binary 1 is stored in the eighth bit to indicate that the color is black. The actual data for transition byte B4 is stored in word 2. The next run in the scan line is white, and only byte B5 is all white. Therefore, the binary number 0000001 is stored in the first seven bits of count word 3, and a binary 0 is stored in the eighth bit. The actual data for byte B6 is stored in transition word 4. With this compression technique, a compression of up to 64:1 is possible, and the maximum possible expansion is only 1:2. With standard run length encoding utilizing 8-bit coding, the maximum possible compression is 128:8 or 16:1 and the expansion can be as great as 1:8. The compression and decompression functions are performed as the raster file data is written onto and read off of the disk.

As illustrated in FIG. 3, interface unit 33 includes a parallel/serial data converter 46 which receives data from and delivers data to direct memory access interface 37 over a 16-bit bidirectional data bus 47. The data converter delivers data in serial form to platemaker 32 via output line 48 and receives serial input data from the platemaker on input line 49. The data converter requests data for new words from the computer via line 51 and receives signals on line 52 when the computer is ready to deliver data for new words. Other status and control signals are delivered to the data converter from the computer on lines such as line 53.

The interface unit also includes start-of-scan logic 56 which receives an input signal from the platemaker at the start of each scan line. In response to this signal, the start-of-scan logic delivers a properly shaped digital pulse to the data converter. The interface unit also includes a reference clock generator 57 which receives 6 mil. pulses from the platemaker and delivers 1 mil.

pulses to the data converter. In the platemaker, the 6 mil. pulses are generated by diverting a portion of the reading beam to a reference mask having lines spaced 6 mils. apart. Each time the beam crosses a line on the reference mask, a pulse is generated, and these pulses are applied to the reference clock generator as input pulses. The reference mask is illustrated in FIGS. 8 and 9 and described more fully hereinafter. The reference clock generator includes a phase locked loop which produces six output pulses for every input pulse, whereby the output of the reference clock generator is a train of pulses corresponding to a distance of 1 mil. in the travel of the laser beams.

A preferred parallel-to-serial data converter is shown in FIG. 4. In this converter, the parallel input data from the computer is applied to the parallel inputs of parallel-input serial-output, shift registers 58, 59. The reference clock signal from generator 57 is applied to the clock inputs of the shift registers, and the output of register 58 is connected to the serial input of register 59. The output of register 59 is connected to the inputs of a NAND gate 61 which is connected to function as an inverter. The output of this gate is connected to one input from a flip-flop 63 which is toggled by the reference clock signal. The output of NAND gate 62 is connected to the input of a NAND gate 64 which is connected to function as a line driver, and the output of this gate is the serialized output data.

FIG. 5 illustrates a preferred serial-to-parallel data converter for use in the embodiment of FIG. 3. In this converter, the serial input data from the platemaker is applied to the serial input of a serial-input, parallel-output shift register 66 through inverters 67, 68. The last parallel output of shift register 66 is connected to the serial input of a second serial-input, parallel-output shaft register 69, and the reference clock signal from generator 57 is applied to the clock inputs of these shift registers. The serial input data is converted to parallel output data which appears at the parallel outputs of shift registers 66, 69, and this data is delivered to the computer via data bus 47.

With the interface unit of FIG. 3, both data compression and data decompression or expansion are performed by the computer. Flow charts for preferred compression and decompression routines are set forth in FIGS. 14–15 and discussed hereinafter. FIG. 6 illustrates an interface unit in which the data is decompressed in the interface unit as it is converted from parallel to serial format. This interface unit includes a buffer 71 and a serial generator and decompressor 72. The buffer receives parallel data from the computer on data bus 73 and delivers this data on data bus 74 to the data generator and compressor which delivers serial data to the platemaker on line 76. In the preferred embodiment, the buffer has two sections each of which can hold four 16-bit words. One section is filled from the computer while data is being transferred from the other to the serializer and decompressor. This provides somewhat faster operation than the system of FIG. 3 where the data converter can only receive data when the computer is not otherwise occupied.

The interface unit of FIG. 6 also includes start-of-scan logic 77, a reference clock generator 78, and a serial-to-parallel data converter 79. The start-of-scan logic and reference clock generator are similar to the corresponding elements in FIG. 3, and the serial-to-parallel data converter is of the type illustrated in FIG. 5. This converter receives serial input data from the platemaker on input line 81 and delivers parallel output data to the computer on data bus 82.

Referring now to FIG. 7, serial data generator and decompressor 72 is shown in detail. The first seven bits of the count words or low order bytes (e.g. words 1,3 in FIG. 2) are applied to the inputs of programmable counters 86, 86, and the eighth bit which carries the color information is applied to the D input of a flip-flop 88. The weighted outputs of counters 86, 87 are connected to the inputs of NOR gates 89, 91, and the outputs of these gates are connected to the input of an AND gate 92. The outputs of flip-flop 88 and AND gate 92 are connected to the control inputs of an eight stage multiplexer 93.

The transition words or high order bytes (e.g. words 2,4 in FIG. 2) are applied to latches 94, 96, and the outputs of the latches are connected to the respective stages of the multiplexer. In addition to receiving one bit of each transition word through the latches, each stage of the multiplexer also receives a logic 1 and a logic 0 input signal. The output of the multiplexer is either all 1's (black) all 0's (white) or the bits of the transition word.

The outputs of multiplexer 93 are connected to the parallel inputs of a parallel-input serial-output shift register 97. The serial output of the shift register is connected to the input of a NAND gate 98 which functions as a line driver. The data at the output of this gate is the decompressed serial output data which is delivered to the platemaker via output line 76.

The reference clock signal is applied to the input of a divide-by-8 counter 101, and the status of this counter is monitored by a NOR gate 102 and a NAND gate 103. The output of gate 102 is high when the bit count is 0, and the output of gate 103 is low when the bit count equals 7. The output of NOR gate 102 is applied to the down counting input of counter 86 through an AND gate 104. The output signal from gate 102 is also inverted and applied to the shift/load input of serializing shift register 97 and to the clock input of a flip-flop 105. The Q output of this flip-flop is connected to a second input of AND gate 104. AND gate 106 receives a second input from the output of AND gate 92, and the output of this gate is connected to the input of a one-shot multivibrator 107. The Q output of this multivibrator is applied to the load inputs of 94, 96, and the Q̄ output is applied to the load inputs of counters 86, 87 and the clear input of flip-flop 105.

Operation and use of the decompressing serializer can be described briefly. Each time a new word is received from buffer 71 it is loaded into counters 86, 87, flip-flop 88 and latches 94, 96. Every time eight bits are output, counters 86, 87 are decremented, and the outputs of these counters and flip-flop 88 determine what gets loaded into the multiplexer and serialized. For example, assume that the coded data comprises two all black bytes followed by a transition byte. During the first two pulses that set an output byte into the shift register, the output of the counters is greater than 0, the output of AND gate 92 is 0, and all 1's are transferred to the shift register. When the counter reaches 0, the output of the AND gate 92 becomes a 1, and the multiplexer transfers the transition word to the shift register. Since the shift register is clocked at the reference clock rate rather than the divided down rate by which the counters are decremented, all eight bits in the data word are serialized between successive decrementing pulses. When all eight bits have been clocked out of the shift register, the next word is loaded, and the process repeats.

The platemaker illustrated in FIGS. 8-10 is for the most part a combination of apparatus disclosed in the above referenced application Ser. No. 758,250 and U.S. Pat. No. 4,081,842, and those disclosures are incorporated herein by reference. In the platemaker, read platen 41 and write platen 43 are mounted in fixed positions on a stationary framework (not shown), and a carriage 111 is mounted on the framework for movement longitudinally or lengthwise of the platens. The carriage is driven in the longitudinal direction by a drive motor 112 and a lead screw 113.

The platemaker includes a helium-neon read laser 116 mounted on the carriage and a UV write laser 117 mounted on the frame. The beam 118 produced by the write laser passes through a modulator 119 and a beam expander 121 to mirrors 122 and 123 which direct the beam to a beam combiner 124. The beam combiner is part of a scanning optical system 126 mounted on the carriage, and it also received the beam 127 from read laser 116 via a mirror 128. The beam combiner comprises a dichroic mirror which reflects the UV write beam and transmits the helium neon read beam.

The combined beam from beam combiner 124 is directed to scanner 131 which causes the beams to scan laterally across the width of the platens. From the scanner, the combined beam passes through an objective lens 131 to a dichroic mirror 133 where the beams are separated. Writing beam 118 is reflected downwardly to the write platen, and reading beam 127 is transmitted to a beam splitter 134. The beam splitter directs portions of the reading beam to read platen 141 and to a reference mask 136.

Reference mask 136 extends the full width of read platen 41 and includes alternately spaced opaque areas 137 and transparent areas 138. In the preferred embodiment, each of these areas has a width of 3 mils. Light passing through the reference mask is sensed by fiber optics 139 and converted to a digitialized electrical signal by a photomultiplier tube 141. The signal from photomultiplier tube 141 is applied to interface unit 133 and utilized in generating the reference clock signal as described hereinbefore.

Light reflected by light and dark areas of copy on read platen 41 is sensed by fiber optics 142 and converted to a digitialized electrical signal by photomultiplier tube 143. The output of photomultiplier tube 143 is connected to the serial data input of interface unit 33 and to one input of a merge circuit 138. Serial output data from the computer interface is applied to a second input of the merge circuit, and the output of this circuit is connected to modulator 119 to control the write laser beam.

As illustrated in FIG. 10, the merge circuit includes EXCLUSIVE OR gates 146, 147 to which data from the read beam and the computer is applied, respectively. Switches 148, 149 provide means for inverting the data by applying either +5 volts or 0 volts to second inputs of the EXCLUSIVE OR gates. The outputs of these gates are connected to the inputs of NAND gates 151, 152, respectively. Means is provided for selectively enabling the NAND gates to pass either the data from the computer or the data from the reading beam or both. This means includes pull-up resistors 153, 154 and a grounding switch 156 connected to second inputs of the NAND gates. Switch 156 is a 3-position switch having its armature connected to ground, two of its terminals connected to the enabling inputs of gates 151, 152 and an off or "merge" position in which neither of the terminals is grounded. When the switch is in the READ BEAM position shown in FIG. 10, NAND gate 152 is disabled, and the data from the reading beam passes through gate 151. With the switch in the COMPUTER position, NAND gate 151 is disabled, and the computer data passes through gate 152. With the switch in the off or MERGE position, both NAND gates are enabled, and the data from both the reading beam and the computer is passed.

The outputs of NAND gates 151, 152 are connected to the inputs an OR gate 157. The output of this gate is connected to one input of an EXCLUSIVE OR gate 158, and the output of this gate is connected to modulator 119. A switch 159 provides means for inverting the output data by applying a voltage of either of +5 volts or 0 volts to a second input of EXCLUSIVE OR gate 158.

Operation and use of the platemaker of FIGS. 8-10 can be described briefly. A paste-up or other copy to be read is placed on read platen 41. The beams scan the read and write platens simultaneously in raster fashion, with scanner 131 deflecting the beams laterally across the width of the platens and the longitudinal movement of the carriage providing scanning at a slower rate along the length of the platens. Modulator 119 deflects the writing beam into or out of the optical path under the control of merge circuit 138 to effect a turning on and off of the beam. The merge circuit receives data from both the read platen and the computer, and the circuit determines whether the data to be imaged on the write platen, comes from the read platen, the computer or both.

FIG. 11 is a flow chart for the program by which source or text data is converted to raster image data. First, a line of text is read into the computer from the disk. That line contains both the text itself and embedded type setting commands. The line is scanned to determine the type setting commands and the characters which are required to typeset the line. The font descriptors which describe the patterns of bits that make up the characters are then read into the computer memory from the disk. Thus, a table is created in the showing all of the fonts needed to generate the line of text.

Next, the raster lines are generated on a line by line basis, picking up all of the characters which are required for each line. After each scan line is generated,, a check is made to determine whether all of the scan lines are now present for all of the characters in the text line. The process repeats until all of the scan lines are present. When all of the scan lines are present, the next line of text is read and the process continues until the end of the text is reached.

FIG. 12 is a flow chart for the program by which data is transferred from the disk to the writing laser and scan information is transferred from the reading laser to the disk. Information such as the file name, mode of data (compressed or uncompressed) and direction (read or write) is input through the terminal. The file is opened on the disk, and if data is to be read from the platemaker, the first scan line is read in its entirety and written on the disk in compressed form. This process continues until all of the lines to be read from the platemaker have been written on the disk. If data is to be transmitted to the platemaker, the first scan line to be written is read from the disk into a buffer and the mode in which it is to be sent to the interface unit is checked. If the interface unit includes a decompressor, the data is sent to the interface unit in compressed form where it is decompressed and sent on the the platemaker. If the interface unit does not include a decompressor, the data is decompressed by the computer and sent to the platemaker. When one scan line has been sent, the next is read from the disk, and the process repeats until the end of the file is reached.

The flow chart for the program for pagination or composition of an entire page image from individual raster files stored in the disk is illustrated in FIG. 13. Data refining files to be combined, the size of the output file, and the location and size parameters for each of the input files is input through the terminal. The dimensional and positioning information is given in scan lines in the y-direction and in bits in the x-direction. The cropping dimensions, output coordinates, and output size are then input for each of the files to be combined. The cropping dimensions define the number of line to be omitted at the top of the file and the number of bits to be omitted at the left side of the file. The output size defines the dimensions of the output image in units of lines and bits, and the output coordinates define the point at which the image begins in the output, e.g. the upper left corner of the image. For text material which is not to be cropped, the parameters are defined accordingly.

Once the parameters are defined, the input files are opened, and the number of lines specified in the cropping dimensions are skipped. The scan line is written on an output buffer which is cleared at the beginning of each line. Each file is then examined to determine whether it is to be included in the particular scan line. If it is to be included, the next scan line from that file is read into the output buffer. If not, the file is ignored. After processing all of the files on the scan line, the line built up in the buffer is written on the disk. The process repeats and continues until all of the scan lines in the output image have been rewritten and transferred to the platemaker.

Referring now to the flow chart of FIG. 14, the data from a scan buffer is compressed a byte at a time. Consecutive bytes that are either all black or all white are counted. When the end of the string of consecutive black or white bytes is detected, the count is output, along with a high-order bit that indicates the color. Thereafter, the transition byte is output. These steps are repeated until the entire scan line is compressed. Two bytes of zeros are then output to denote the end of the scan.

FIG. 15 illustrates a program routine for reexpanding the compressed data to reconstruct the original scan line. The compressed data consists of a series of two byte pairs of data. Th first of these is the runcount; the second is the transition byte. If both of these are zero, the end of the data for a scan has been reached. If not, the high-order bit of the runcount indicates the color of the next sequence to be generated. The low-order 7 bits of the runcount are used to generate the proper number of bytes that are all white or all black, as selected by the color bit. Following these bytes, the transition byte is output. This process continues until the end of scan is detected.

The invention has a number of important features and advantages. It provides relatively high speed electronic composition or pagination of any combination of data including text, logotypes, line art and halftones created by the computer or scanned by the reading beam of the platemaker. A substantial saving in memory size is achieved by compressing the stored data in a byte-oriented run length format which allows the computer to operate at the word level where it is most efficient. While the invention is particularly suitable for the newspaper publishing and commercial printing industries, it also has application in a number of other areas, including art work generation, map production, printed circuit board design and production, intergrated circuit design and production, mechanical and architectural design and the like.

It is apparent from the foregoing that a new and improved computerized laser engraving system and method have been provided. While only certain presently preferred embodiments have been described in detail, as will be apparent with those familiar with the art, certain changes and modifications can be made without departing from the scope of the invention as defined by the following claims.

We claim:

1. In a method for imaging data on a surface scanned by a writing beam, the steps of: scanning copy with a reading beam to form a read data signal representative of the copy, storing the read data signal in a compressed format in the memory of a computer, inputting additional data through the computer and storing a signal representative thereof in the compressed format in the computer memory, decompressing selected portions of the stored signals to provide signals representative of read beam data and computer input data to be imaged together on the writing surface, and modulating the writing beam with the decompressed signal to form an image of the selected read beam data and the selected computer input data on the writing surface.

2. The method of claim 1 wherein additional copy is scanned by the reading beam while the image is being formed on the writing surface to provide a signal representative of the additional copy, and the writing beam is modulated by both the decompressed signal and the additional copy signal whereby the image formed on the writing surface includes data from the additional copy in addition to the data input through the computer and the stored data.

3. In a system for imaging data on a surface: a laser platemaker having a reading beam for scanning a read platen to provide a read data signal representative of copy placed on the platen and a writing beam for scanning a write platen to form an image thereon, modulation means for controlling the intensity of the writing beam as it scans the write platen, a computer having an input device and a memory for creating and storing input data signals, and an interface unit interconnecting the computer and platemaker for selectively transferring the read data signal from the platemaker to the computer for storage therein and for applying signals from the computer to the modulation means to permit selective imaging on the write platen of data scanned from the read platen and data created by the computer.

4. The system of claim 3 further including means for compressing the data signals for storage in the computer memory.

5. The system of claim 3 wherein the platemaker includes means for effecting simultaneous scanning of the read platen and the write platen, together with means for applying a real time signal representative of copy on the read platen to the modulation means whereby the image formed on the write platen includes real time data from the read platen.

6. In a method for imaging data on a writing surface, the steps of: providing a binary signal representative of the data, said signal comprising a plurality of bytes each containing a predetermined number of data bits, compressing the data signal by encoding it with a first word respresentative of the number of successive bytes in which all of the bits are of one type and a second word consisting of the actual data bits for a byte in which a change in the bit type occurs, storing the words representing the compressed data, accessing and decompressing selected portions of the stored data, and forming an image of the decompressed data on the writing surface.

7. In a method for imaging data on a surface scanned by a writing beam, the steps of: scanning copy with a reading beam to form a read beam data signal representative of the copy, compressing the data by encoding it with a first word representative of the number of successive groups of bits of one type in the data and a second word consisting of the actual data bits for a group of bits in which a change in the bit type occurs, storing a signal representative of the compressed data in the memory of computer, inputting additional data through the computer and storing a signal representative thereof in the compressed format in the computer memory, decompressing the selected portions of the stored signals to provide signals representative of read beam data and computer input data to be imaged together on the writing surface, and modulating the writing beam with the decompressed signal to form an image of the selected read beam data and the selected computer input data on the writing surface.

8. In a system for imaging data on a surface: a laser platemaker having a reading beam for scanning a read platen to provide a read data signal representative of copy placed on the platen and a writing beam for scanning a write platen to form an image thereon, modulation means for controlling the intensity of the writing beam as it scans the write platen, a computer having an input device and a memory for creating and storing input data signals, means for compressing the data signals for storage in the computer memory by encoding the data with a first word representative of the number of successive groups of bits of one type in the data and a second word consisting of the actual data bits for a group of bits in which a change in the bit type occurs, and an interface unit interconnecting the computer and platemaker for selectively transferring the read data signal from the platemaker to the computer for storage therein and for applying signals from the computer to the modulation means to permit selective imaging on the write platen of data scanned from the read platen and data created by the computer.

* * * * *